United States Patent [19]

Kubis

[11] Patent Number: 4,877,176
[45] Date of Patent: Oct. 31, 1989

[54] SOLDERING PINS INTO PRINTED CIRCUIT BOARDS

[75] Inventor: Leon S. Kubis, West Palm Beach, Fla.

[73] Assignee: Northern Telecom Limited, Montreal, Canada

[21] Appl. No.: 125,152

[22] Filed: Nov. 25, 1987

[51] Int. Cl.[4] .............................................. B23K 31/02
[52] U.S. Cl. ................................ 228/173.5; 228/180.1
[58] Field of Search .................. 228/173.5, 180.1, 165, 228/180.2, 6.2, 179; 24/356, 711.2

[56] References Cited

U.S. PATENT DOCUMENTS

| 497,801 | 5/1893 | Le Gresley-Cox | 24/711.2 |
|---|---|---|---|
| 3,834,015 | 9/1974 | DiRenzo | 228/180.1 |
| 3,977,075 | 8/1976 | Lynch | 228/180.1 |
| 4,011,980 | 3/1977 | Dvorak | 228/180.1 |
| 4,050,621 | 9/1977 | Bouley | 228/180.1 |
| 4,373,259 | 2/1983 | Motsch | 228/180.1 |
| 4,420,877 | 12/1983 | McKenzie | 228/180.1 |

Primary Examiner—Kurt Rowan
Attorney, Agent, or Firm—Foley & Lardner, Schwartz, Jeffery, Schwaab, Mack, Blumenthal & Evans

[57] ABSTRACT

Soldering splined pins into holes in printed circuit boards by providing small volumetric gaps between the splines to allow thin layers of solder lining, the holes to be sufficiently thick to block the gaps during solder flow. The solder may have a maximum thickness of 0.001 inches to block the gaps unassisted by additional solder.

17 Claims, 4 Drawing Sheets

SOLDERING PINS INTO PRINTED CIRCUIT BOARDS

This invention relates to the soldering of pins into printed circuit boards.

In the manufacture of printed circuit board and pin assemblies, the printed circuit boards are prepared with holes extending through them, the holes being lined with conductive material forming part of the printed circuit, and conductive pins extend into the holes. In one method of assembly, each pin is soldered to the lining of conductive material.

To ensure a proper conductive path is created between each pin and the conductive lining of its associated hole, each pin is provided with a splined section, the splines of which project into the conductive material so as to intimately engage it for the transference of electric current. This is in addition to the electrical pathway created between the pin and the conductive lining through the solder material. A problem which exists however, in the assembly is that gaps between the splines need to be blocked with solder in at least one position along each hole to maximize contact between solder and pin and to ensure the best possible current pathway between pin and conductive lining. The solder for this purpose is conventionally provided partly by a preformed layer of solidified solder on the inside surface of the conductive lining material and partly by an annulus of solder (referred to as a "doughnut"). The solder doughnut is disposed around the top end of each pin and is supported by the printed circuit board immediately above the upper outlet to the hole when the pin is located within its hole. The solder of the inner layer and of the doughnut is then heated to cause it to flow to fill the gaps between the splines and during the soldering process. The solder material of the doughnut flows downwardly between the splines and into the hole during this process.

It has been found that in the above method, inordinately excessive amounts of solder are used, most of which is present in the doughnuts.

The present invention seeks to provide a method for soldering a pin into a hole of a printed circuit board in which the use of a doughnut is eliminated thereby saving on solder material.

Accordingly, the present invention provides a method of soldering a pin having a splined section into a hole lined with conductive material in a printed circuit board comprising:- providing a layer of solidified solder within the hole and on the inner surface of the conductive material; providing the pin with suitably small volumetric spaces between the splines to enable the solder of the layer, when it is caused to flow and unassisted by additional solder, to completely block all gaps remaining between the splines with the pin assembled into the hole; inserting the pin into the hole to locate the splined section within the hole with the splines projecting through the solidified solder and into the conductive material; and with the board disposed with the pin and hole extending vertically and with avoidance of additional solder, causing solely the solder of the layer to flow to bond the pin to the conductive layer, the solder flowing downwardly and increasing in thickness towards the bottom of the hole to completely block all of said gaps between the splines in at least one position along the hole.

In the method according to the invention, the volumetric spaces between the splines may be provided sufficiently small by having in excess of four splines and possibly eight splines for the pin. In another and preferred way of providing suitably small volumetric spaces, a base region between pairs of splines has a diameter such that it is spaced a maximum distance of 0.002 inches from the solder layer thereby minimizing the radial depth of all gaps between the solder layer and the base region between the splines.

It has been found that with the use of the inventive concept, the space between splines may be made sufficiently small that the layer of solder need have a maximum thickness of 0.001 inches and may even have a thickness of 0.0005 inches while still successfully blocking the gaps between the splines.

With the maximum distance of 0.002 inches between the base regions between splines and the solder layer, it is preferable for the base regions to have smooth ungrooved surfaces which advantageously lie upon the surface of a cylinder. It is also preferred in this structure to have a maximum of four splines equally spaced around the pin so as to maximize the width of each base region circumferentially of the pin thereby promoting solder flow into contact with each base region while providing sufficient splines to stabilize the pin in its hole.

The invention further comprises a printed circuit board and pin assembly in which the board has at least one hole having a lining of conductive material and a pin extends into the hole, the pin having a plurality of splines disposed within the hole and projecting into and soldered to the 15 conductive material, the pin also having base regions between the splines, said base regions lying at a maximum distance of 0.002 inches from the conductive material.

The invention also includes a circuit board pin having a splined section formed with a plurality of splines spaced apart around the pin and base regions between the splines, each base region having a surface lying at a radial distance from the longitudinal axis of the pin which differs from the radial distance of tips of the splines by a maximum of 0.005 inches.

Embodiments of the invention will now be described by way of example, with reference to the accompanying drawings, in which.

Figure 1:
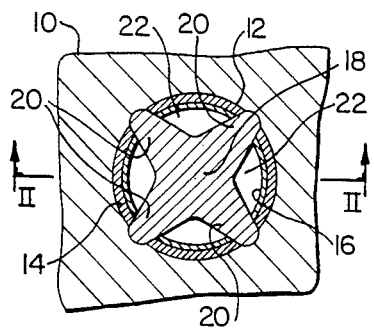
FIG. 1 is a cross-sectional view through part of a prior art circuit board showing a pin in position before a soldering operation.

As shown in FIG. 1, a conventional circuit board 10 is formed from glass fiber and resin composition. A conventional method of soldering pins into the printed circuit board comprises providing the circuit board 10 with a plurality of holes 12, each hole being lined with a layer 14 of conductive material e.g. copper which is nominally 0.002 inches thick and which forms part of the printed circuit. The inside diameter of layer 14 is approximately 0.035 inches. Within the layer of copper 14 is disposed a layer 16 of solder which may be 0.001 inches thick and is normally a tin/lead composition.

Figure 2:
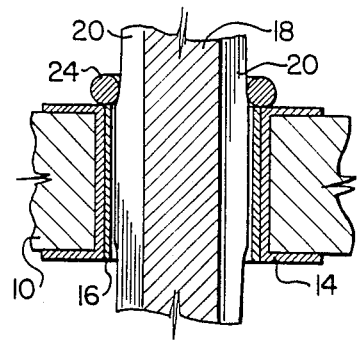
FIG. 2 is a cross-sectional view taken along line II—II in FIG. 1 and showing the pin in the circuit board and preparatory to soldering the pin in position.

A pin 18 to be soldered in position in each hole has four splines 20 which are equally spaced apart around the pin in a splined region as shown in FIG. 1. The minimum diameter of the pin in a base region between splines is a nominal 0.017 inches and the spline tips have a nominal diameter of 0.041 inches. Each pin is pressed into its associated hole so that the outer ends of the splines 20 project through the solder and into the conductive layer 14. These splines may project right through the copper layer to embed themselves slightly into the glass fiber material of the board itself. This is as shown in FIG. 1. To solder each pin into its hole correctly, it is necessary to block all gaps 22, defined between the splines and the inner solder layer, with solder material in at least one position along the hole so that a continuous interface is created between the solder and the pin to ensure that the best possible current path is provided. As the amount of solder formed in the layer 16 is never sufficient to flow and totally bridge across the gaps 22, then extra solder material has to be provided. This is in the form of annuli or "doughnuts" 24 of solder which are used one for each hole. As can be seen from FIG. 2, the soldering operation is performed with the printed circuit board in a substantially horizontal position and each doughnut 24 is disposed encircling its pin and supported by the printed circuit board. Heat is then provided to cause the solder to flow. The solder in each doughnut flows into the gaps 22 to provide solder additional to that of the associated layer 16 to bridge and block each of the gaps 22 in at least one location along each of the holes 12.

As shown by the embodiments to be described, the methods according to the invention successfully block gaps between splines of the pins without the use of additional solder material such as is provided by the doughnuts 24.

Figure 4:
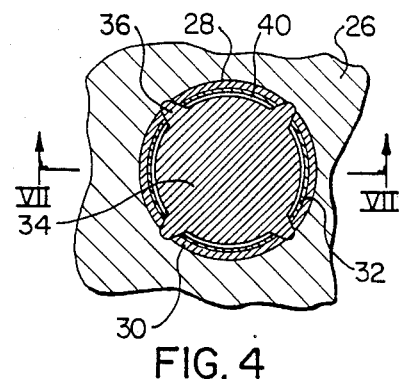
FIG. 4 is a view similar to FIG. 1 showing the pin of the first embodiment located in a printed circuit board preparatory to being soldered in position by a method according to a first embodiment.

In a first embodiment as shown by FIG. 4, a printed circuit board 26 is provided with a plurality of holes 28 each of which is nominally of 0.039 inches diameter. Each hole is lined with a layer 30 of conductive material such as copper which forms part of the printed circuit of the board. This layer is a nominal 0.002 inches in thickness thereby providing a nominal 0.035 inch inside diameter to layer 30. Within the layer 30 is disposed a solidified layer 32 of solder having a nominal thickness of 0.0005 inches and thus a nominal inside diameter of 0.034 inches.

Figure 3:
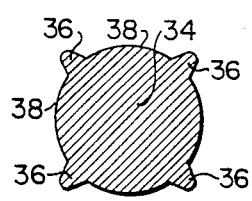
FIG. 3 is a radial cross-sectional view through a printed circuit board pin of a first embodiment.

Into each of the holes 28 is inserted a pin 34 having a splined section with a cross-sectional shape as shown in FIG. 3. The splined section has four splines 36 equally spaced apart around the axis of the pin, i.e. an angle of 90°. is subtended around the center between adjacent splines. In the embodiment, instead of the area between adjacent splines being formed as a conventional groove as in the case shown in the prior art FIG. 1, the base region 38 between adjacent splines has a substantially smooth ungrooved surface forming part of a cylindrical surface having a diameter of 0.033 inches.

When each pin is assembled into its hole, as shown in FIG. 4, the splines extend through the solder layer 32 and project into the conductive layer 30. The distance between the layer 32 and each base region 38 of each pin is about 0.0005 inches. This distance may be increased to 0.002 inches dependent upon design considerations. The tips of the splines lie nominally at a diameter of 0.041 inches so that the splines extend substantially through the conductive material and may even project into the surrounding glass fiber material of the board 26, dependent upon the manufacturing limits for the size of the holes in the board 26. As can be seen, the inside diameter of the layer 32 is a nominal 0.034 inches and as the surfaces of the base regions 38 extend to a diameter of 0.033 inches then there is a clearance of 0.0005 inches between the base regions and the solidified solder layer.

Figure 5:
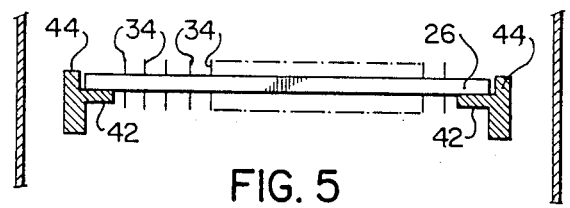
FIGS. 5 and 6 show diagrammatically, cross-sectional and side elevational views of printed circuit boards fitted with pins as shown in FIG. 4 and being subjected to a heat treatment to perform a soldering operation.
Figure 6:
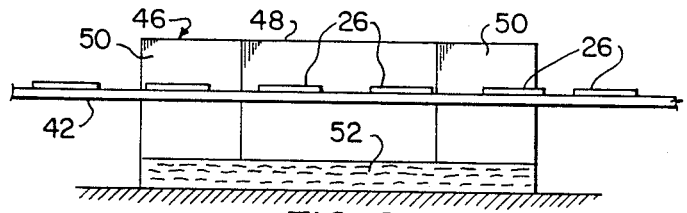
Figure 7:
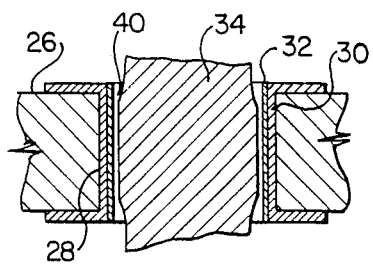
FIG. 7 is a cross-sectional view taken along line VII—VII in FIG. 4 and showing the assembly of pin and board before heat treatment.

To solder the pins in position within the holes, the printed circuit board is laid upon a conveyor 42 (see FIGS. 5 and 6) for passage through a vapor phase heating process of conventional form. As shown by FIG. 5, the conveyor 42 has upstanding sides 44 which support the board 26 horizontally by contact with the underside of the board so that the pins may extend through the board from side-to-side completely unobstructed. The conveyor moves to convey the printed circuit board in succession with other printed circuit boards assembled with pins through a vapor phase soldering machine 46. This is of conventional construction in that it has a central chamber 48 in which a vapor atmosphere is created at a desired temperature This vapor atmosphere contacts the solder material and transfers heat into the solder to cause it to flow during passage of each board through the chamber 48. The temperature and speed of movement of each board through the chamber 48 is such that the solder is caused to flow sufficiently to perform the soldering operation and without loss of solder from the lower ends of the holes 26. Flanking each side of the central chamber 48 is a core chamber 50. At the bottom of the machine 46 is a bath 52 of liquid freon. Heaters (not shown) are provided in the central chamber 48 for heating the freon to form the vapor cloud. In known fashion, a circulation process causes the vapor to be condensed in the chambers 50 so that the condensed freon is returned to the bath 52. Before a printed circuit board 26 enters the central chamber 48, there are gaps 40 provided between adjacent splines 36 of the pins 34, i.e. as defined between the splines, the base region 38 and the inner surface of the solder layer 32. This is shown by FIGS. 4 and 7.

Figure 8:
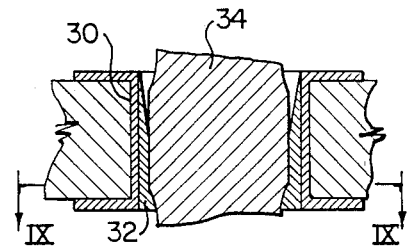
FIG. 8 is a view similar to FIG. 7 showing the assembly after heat treatment.
Figure 9:
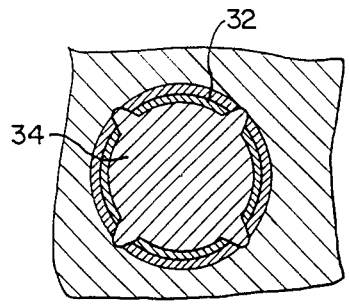
FIG. 9 is a cross-sectional view taken along line IX—IX through FIG. 8.

As the conveyor moves each printed circuit board through the chamber 48, heat transferred into the solder of the layers 32 causes it to flow. As the holes 28 and the pins 34 are disposed vertically then this flow takes place downwardly towards the bottom of the holes. The dimensions of the pin are such that the gaps 40 provided between the splines and the inner surface of each layer 32 (as discussed above) are sufficiently small that as the solder flows downwardly it thickens towards the lower end of each of the holes so as to flow inwardly upon the pin and completely block each of the gaps towards the lower ends of the holes. This situation is shown in FIGS. 8 and 9.

Flow of solder in intimate contact with pin surfaces is promoted or encouraged by a combination of factors. A first of these is that the splines do not taper together to form a deep groove f decreasing width. Instead, a minimum number of splines, i.e. four, are provided for pin stability within its hole thus maximizing the width of the surface of each base region circumferentially of the pin for unrestricted flow of solder into contact with that surface. The small gap of 0.0005 inches, or, in extreme conditions of 0.002 inches, requires the solder to flow inwardly for only a short distance to make intimate surface contact. Furthermore, intimate surface contact is ensured by the substantially smooth ungrooved surface of each base region and, as each base region forms part of a cylindrical surface, it is slightly convex thereby positively outwardly exposing it between the splines to the flow of solder. The blocking of the gaps is effected by intimate interfacial contact between the solder and each pin completely around the surface of the pin from one spline to another whereby no air gaps remain from one side of the interfacial region to the other.

As can be seen from the above description, in the first embodiment, the gaps between the splines are sufficiently small and the pin surfaces shaped to ensure that the quantity of solder in the layer 32 will effectively close any air gaps during the soldering procedure without the use of any solder apart from that which originates in the layer 32 itself. Hence, although the solder is only of the normal thickness for solder layers provided within holes of a printed circuit board, that is a nominal 0.001 inches or even 0.0005 inches as in the first embodiment, nevertheless this is sufficient to enable the performance of a commercially acceptable soldering process to the inserted pipe. Hence, the use of extra solder material, its added expense and the preparation of doughnuts of solder and their location around the pins are avoided. It is found that with the solder at its nominal thickness of 0.001 inches and the maximum gap of 0.002 inches from the solder to the base regions of the pin, then the radial maximum distance from the base region surface to tips of the splines is about 0.006 inches with a conductive layer thickness of 0.002 inches.

Figure 10:
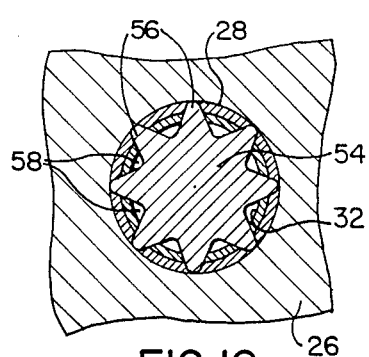
FIGS. 10 and 11 are cross-sectional views of a pin and board assembly respectively, before and after heat treatment according to a second embodiment of the invention.
Figure 11:
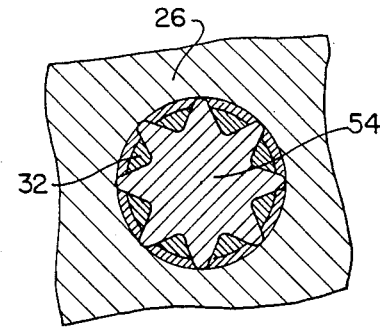

In a second embodiment, (FIG. 10), a pin 54 inserted into each of the holes 28 in the board 26 comprises eight axially extending splines 56 which are equally spaced apart around the axis of the pin. It will be appreciated that with the increase in splines above the nominal four which are conventionally used, then the volumetric spaces between the splines correspondingly become smaller. In this embodiment, the spaces 58 between the splines are sufficiently small when taking into account the diameter at the bases of the splines, that the solder when it flows from the layer 32 completely blocks the spaces 58 by intimate engagement with the surfaces of the pin in at least one axial location along each hole. This is shown by FIG. 11. The soldering process is followed in the manner described in the first embodiment so that the solder flows downwardly to form thicker regions towards the lower end of the holes and completely block all the gaps 58 as may be seen from the cross-section through part of a circuit board and pin assembly of FIG. 11.

In the second embodiment, because of the tapering narrow spaces between splines, care needs to be taken that solder flows against any surface drag on the splines into the bottom of the spaces sufficient to block them.

What is claimed is:

1. A method of soldering a pin having a splined section into a hole lined with conductive material in a printed circuit board comprising:
    providing a layer of solidified solder within the hole and on the inner surface of the conductive material;
    said layer of solder having a maximum nominal thickness of 0.001 inches;
    providing a pin with a substantially circular cross-section and a plurality of splines protruding radially therefrom, the radial length of said protruding splines being substantially equal to the radial thickness of said conductive material and said solder layer, the diameter of said circular cross-section being substantially equal to the inner diameter of said lined, solder-layered hole;
    inserting the pin into the hole to locate the splined section within the hole with the splines projecting through the solidified solder and into the conductive material;
    with the board disposed with the pin and hole extending vertically and with the avoidance of additional solder, flowing solely the solder layer to bond the pin to the conductive layer, said solder flowing downwardly and increasing in thickness towards the bottom of the hole; and
    completely blocking all the gaps between the splines in at least one position along the hole.

2. A method according to claim 1 comprising providing the pin a substantially circular cross-section having a diameter such that it lies within 0.002 inches from the solder layer with the pin inserted into the hole and before the solder layer is caused to flow.

3. A method according to claim 2 comprising providing base regions between the splines with substantially smooth ungrooved surfaces from spline to spline.

4. A method according to claim 3 comprising providing each base region with its surface forming part of a cylindrical surface centered on the longitudinal axis of the pin.

5. A method according to claim 3 comprising providing the pin with four splines equally spaced apart around the pin in the splined section.

6. A method according to claim 4 comprising providing the pin with four splines equally spaced apart around the pin in the splined section.

7. A printed circuit board and pin assembly in which the board has at least one hole having a lining of conductive material and a pin extends into the hole, the pin having a splined section comprising a plurality of protruding splines disposed within the hole and projecting into and soldered to the conductive material, said splined section having a substantially circular cross-section, the radial length of said protruding splines being substantially equal to the radial thickness of said conductive material and said solder, the diameter of said circular cross-section being substantially equal to said lined, soldered hole.

8. A printed circuit board and pin assembly according to claim 7, wherein a portion of the splined section between the splines forms part of a cylindrical surface centered on the longitudinal axis of the pin.

9. A printed circuit board and pin assembly according to claim 7 wherein the pin has four splines equally spaced apart around its splined section.

10. A printed circuit board and pin assembly according to claim 7 wherein the pin has four splines equally spaced apart around its splined section.

11. A circuit board pin having a splined section spaced apart around the pin and extending from a region having a substantially circular cross-section such that the radius of said region of circular cross-section differs from the radial distance of tips of the splines by a maximum of 0.006 inches and wherein said region forms part of a cylindrical surface centered on the longitudinal axis of the pin.

12. A circuit board pin according to claim 11 having four splines equally spaced apart around the pin in the splined section.

13. A circuit board pin according to claim 11 having four splines equally spaced apart around the pin in the splined section.

14. The printed circuit board and pin assembly according to claim 7, wherein the diameter of said substantially circular cross-section is a maximum of 0.003 inches less than the inner diameter of said lining of conductive material.

15. A method of forming a printed circuit board and pin assembly comprising:
   providing a hole in the printed circuit board, the hole lined with conductive material and a layer of solidified solder within the hole and upon the inner surface of the conductive material, the layer of solder having a maximum nominal thickness of 0.001 inches;
   providing a circuit board pin having a splined section formed with a plurality of splines spaced apart around the pin and having base regions extending between the splines, each base region having a surface of convex curvature around the pin and in which:
   (a) the radial distance of each convex surface from a longitudinal axis of the pin differs from the radial distance of the tips of the splines from a longitudinal axis of the pin by a maximum of 0.006 inches; and
   (b) the radius of each convex surface is at a maximum of 0.002 inches less than the nominal radius of the inside surface of the solidified layer;
   inserting the pin into the hole to locate the splined section within the hole with the splines projecting through the solidified solder and into the conductive material; and
   with the board disposed with the pin and hole extending vertically and with the avoidance of additional solder, causing solely the solder of the layer to flow to bond the pin to the conductive layer, the solder flowing downwardly and increasing in thickness towards the bottom of the hole to completely block all the gaps between the splines in at least one position along the hole.

16. A printed circuit board and pin assembly in which the board has at least one hole having a lining of conductive material and a pin extending into the hole, and in which:
   the pin has a splined section located within the hole, the splined section formed with a plurality of splines spaced apart around the pin, the pin also having base regions extending between the splines, each base region having a surface of convex curvature around the pin and the radial distance of each convex surface from a longitudinal axis of the pin differing from the radial distance of the tips of the splines from said axis by a maximum of 0.006 inches; and
   the pins project into and are soldered to the conductive material and the base regions lie at a maximum distance of 0.003 inches from the inner surface of the conductive material.

17. An assembly according to claim 16 wherein the convex surface of each base region forms part of a cylindrical surface centered on the longitudinal axis of the pin.

* * * * *